United States Patent [19]
Hirayanagi

[11] Patent Number: 5,847,813
[45] Date of Patent: Dec. 8, 1998

[54] MASK HOLDER FOR MICROLITHOGRAPHY EXPOSURE

[75] Inventor: Noriyuki Hirayanagi, Kawasaki, Japan

[73] Assignee: Nikon Corporation, Tokyo, Japan

[21] Appl. No.: 908,529

[22] Filed: Aug. 7, 1997

[30]  Foreign Application Priority Data

Aug. 7, 1996 [JP] Japan .................................. 8-208023

[51] Int. Cl.$^6$ ............................ G03B 27/62; G03B 27/58
[52] U.S. Cl. ................................................ 355/75; 355/73
[58] Field of Search ................................ 355/53, 72, 73, 355/75, 76; 430/5; 358/498

[56]  References Cited

U.S. PATENT DOCUMENTS

| | | | |
|---|---|---|---|
| 4,833,051 | 5/1989 | Imamura ........................................ 430/5 |
| 4,837,123 | 6/1989 | Kato et al. ................................... 430/269 |
| 4,924,258 | 5/1990 | Tsutsui ........................................ 355/53 |
| 4,963,921 | 10/1990 | Kariya et al. ................................ 355/53 |
| 5,012,353 | 4/1991 | Yoshino et al. ............................. 358/401 |
| 5,260,151 | 11/1993 | Berger et al. ................................. 430/5 |
| 5,301,043 | 4/1994 | Ichikawa ................................... 358/498 |
| 5,471,279 | 11/1995 | Takizawa .................................... 355/73 |
| 5,477,310 | 12/1995 | Lamb, Jr. et al. .......................... 355/72 |
| 5,544,213 | 8/1996 | Chiba et al. ................................ 378/34 |
| 5,608,773 | 3/1997 | Korenaga .................................... 378/34 |
| 5,621,502 | 4/1997 | Bronaugh et al. .......................... 355/79 |

FOREIGN PATENT DOCUMENTS 5-291125 (A)  5/1993  Japan .

*Primary Examiner*—David M. Gray
*Assistant Examiner*—Henry Hung Nguyen
*Attorney, Agent, or Firm*—Klarquist Sparkman Campbell Leigh & Whinston, LLP

[57]  ABSTRACT

Mask holders are disclosed for holding a mask used during a microlithographic exposure. The mask holder comprises an outer frame and an inner frame. The outer frame contacts the periphery of a main surface of the mask to hold the mask. The inner frame is connected to the outer frame, and contacts an inner portion of said main surface of the mask to hold the mask. The mask holder can include one or more electrostatic and/or vacuum chucks, a thermally conductive material that contacts the mask whenever the mask is being held by the mask holder, and/or an electrically conductive material to discharge accumulated electrical charge on the mask during use.

12 Claims, 5 Drawing Sheets

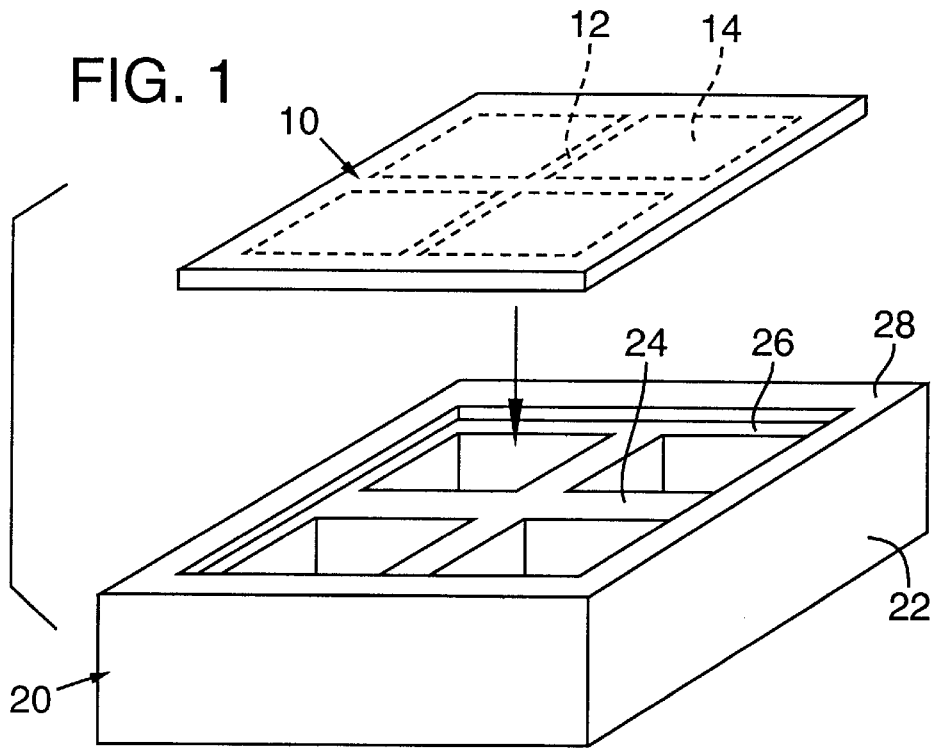
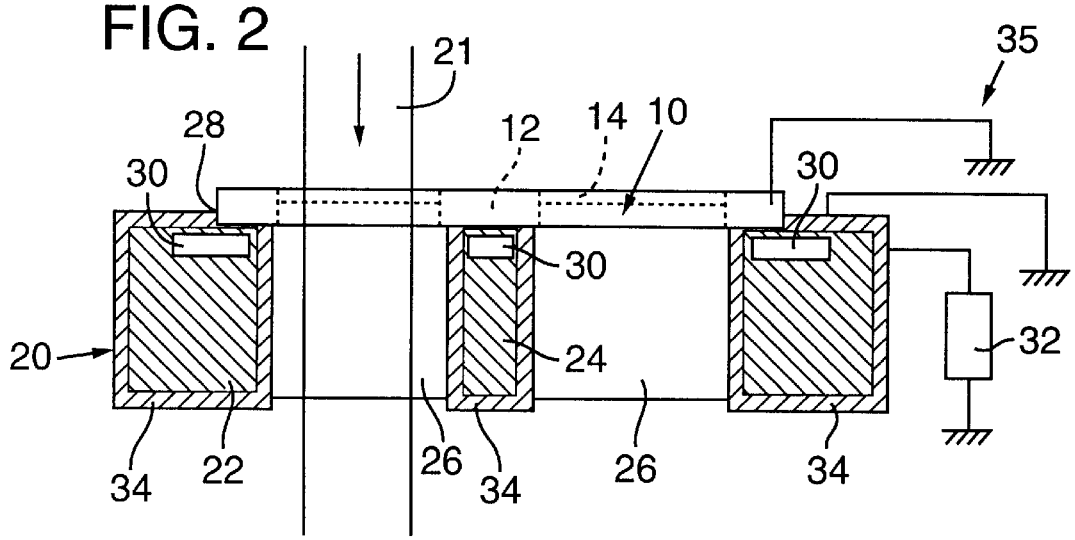

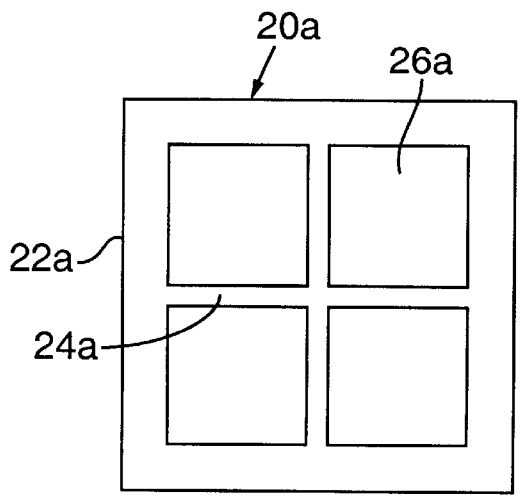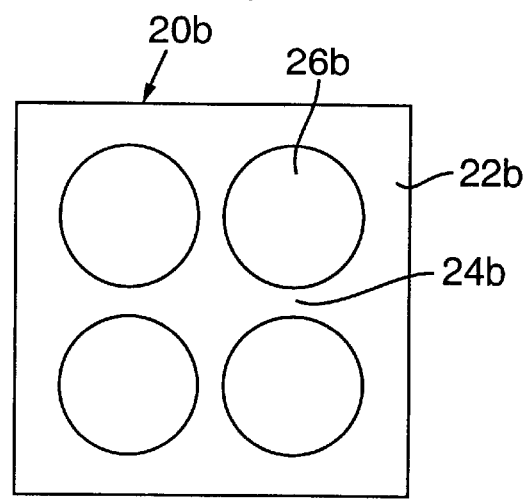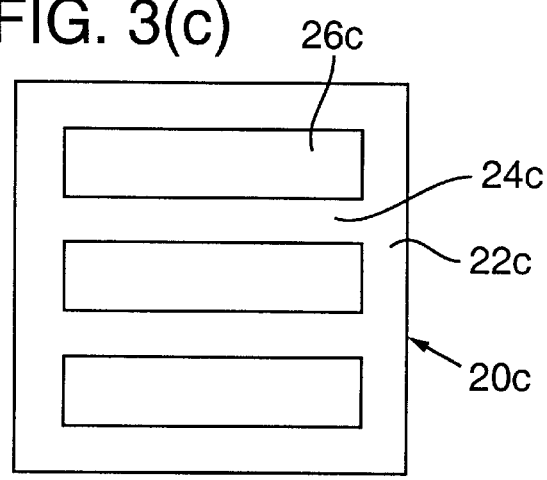

MASK HOLDER FOR MICROLITHOGRAPHY EXPOSURE

FIELD OF THE INVENTION

This invention relates to a device for holding a mask or reticle as used in, for example, a microlithography apparatus for transferring a pattern, defined by the mask or reticle, onto a sensitive substrate, for manufacturing semiconductor devices, liquid crystal displays, etc.

BACKGROUND OF THE INVENTION

As used herein, a "mask" (also termed a "reticle") is a structure that defines a pattern that is to be projection-transferred onto a sensitive substrate, such as a silicon wafer or glass plate, using light or a charged-particle beam. In defining the pattern, the mask can have any of various transmissive regions, reflecting regions, and/or absorptive regions with respect to the illuminating radiation used to perform the projection exposure.

In conventional methods and apparatus, the mask is held, during use, by a mask-holding device, termed herein a "mask holder." A conventional mask holder supports the mask at the periphery of the mask, usually by means of at least one "vacuum chuck". An example of a conventional mask holder 2 employing multiple vacuum chucks 4 arranged around the peripheral surface 2a of the mask holder 2 is shown in FIG. 8. A mask 1 is placed on the mask holder 2; application of a subatmospheric pressure to the vacuum chucks 4 affixes the mask 1 to the mask holder 2.

In the conventional mask holder as shown in FIG. 8, the mask 1 is held only by the peripheral surface 2a, resulting in the central regions of the mask being suspended without support. The mass of the mask 1 can cause the center of the mask to sag relative to the periphery of the mask, which can distort the pattern defined by the mask. Such distortion of the mask 1 can result in a corresponding distortion of the pattern as transferred to (i.e., projection-exposed onto) a substrate. Such distortion of the transferred image can be substantial as the size of the mask is increased, and the undesirable influence of the distortion becomes serious as the feature sizes of, e.g., semiconductor devices continues to be reduced.

SUMMARY OF THE INVENTION

In view of the foregoing shortcomings of the prior art, an object of the invention to provide a mask holder that can prevent or suppress sagging distortion of a mask as the mask is being held by a mask holder.

To achieve the object, mask holders according to preferred embodiments of the invention comprise an outer frame and an inner frame. When holding a mask, the outer frame of the mask holder contacts the periphery of a major surface of the mask. The inner frame is connected to the outer frame and contacts an inner portion of the major surface of the mask.

Because the mask is supported not only by the outer frame, but also by the inner frame, any significant distortion of the mask is prevented. Also, any heating of the mask is thermally conducted to the inner frame and the outer frame of the mask holder through direct contact, thereby efficiently removing the heat from the mask.

The foregoing and other features and advantages of the invention will be more apparent from the following detailed description that proceeds with reference to the accompanying drawings.

BRIEF DESCRIPTION OF THE DRAWINGS

FIG. 1 is a perspective view of a mask holder according to a first representative embodiment of the invention.

FIG. 2 is a sectional view of the mask holder of the FIG. 1 embodiment, showing the electrodes that electrostatically attract the mask.

FIGS. 3(a)–3(c) are plan views of several example lattice configurations of the mask holder of FIG. 1.

DETAILED DESCRIPTION OF THE PREFERRED EMBODIMENTS

Figure 4:
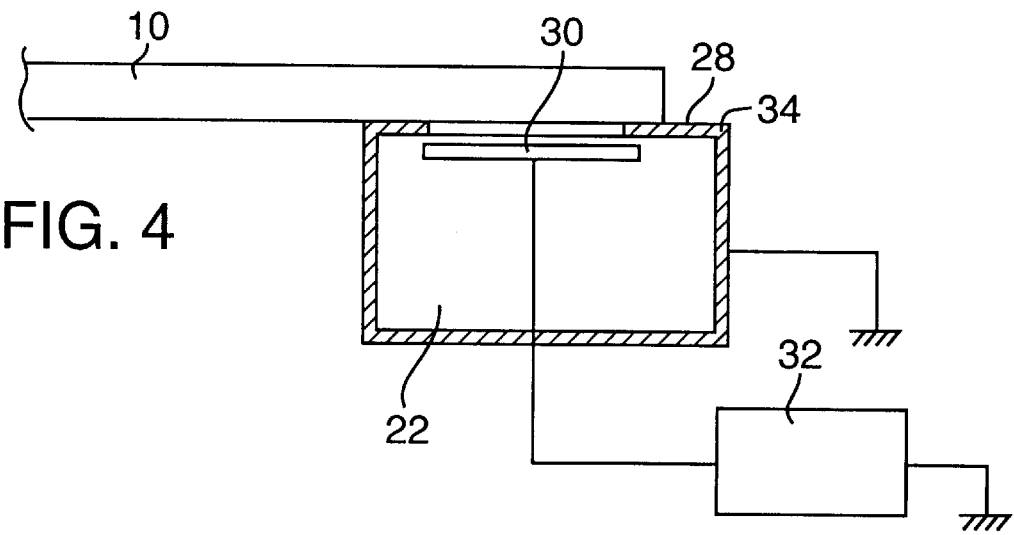
FIG. 4 is a partial sectional view of another alternative configuration of the mask holder according to the first embodiment.

A first representative embodiment of a mask holder 20 according to the invention is shown in FIG. 1. The mask holder 20 is suitable for holding a mask 10 that is illuminated by a charged particle beam, such as an electron beam. Such a mask 10 typically has a latticed configuration as disclosed in, for example, Japanese laid-open patent document no. 5-291125. The mask 10 comprises a lattice 12 with members each having a thickness of 1–2 mm and a width of about 5 mm, and membranous regions 14 that extend between the members of the lattice 12.

A respective portion of an overall mask pattern is defined in each of the membranous regions 14. The membranous regions typically have a thickness of 1–20 $\mu$m The thickness and width of the members of the lattice 12 and the membranous regions 14 are appropriate for the purpose and use of the mask 10. The mask can be made of any suitable material such as, but not limited to, gold, silicon, and diamond.

When a membranous region 14 is illuminated by an electron beam that passes through the membranous region and is focused onto a sensitive substrate, the pattern portion defined in the membranous region 14 is transferred onto a corresponding region on the substrate.

The mask holder 20 comprises an outer frame 22 and an inner frame 24. Multiple voids 26 are defined by the outer frame 22 and the inner frames 24. The voids 26 correspond in size, position, and spacing from one another to the membranous regions 14 of the mask 10. The top surfaces of the outer frame 22 and the inner frame 24 comprise a mask-holding surface 28. The mask-holding surface 28 is preferably covered with a material having a high thermal conductivity, preferably silicon carbide or diamond. Thus, any heat generated or accumulated in the mask 10 can be efficiently transferred to the mask holder 20 and thus conducted away from the mask 10.

When the mask 10 is placed on the mask holder 20, the mask 10 is aligned with the mask holder 20 such that the lattice 12 of the mask 10 is in register with the inner frame 24. An exposure beam 21 (FIG. 2), used to transfer the pattern defined by the mask 10 onto a substrate (not shown), and an alignment beam, used for aligning the mask 10, pass through one of the membranous areas 14 and the corresponding void 26 of the mask holder 20.

The exposure beam 21 passing through a membranous region 14 is preferably not obscured or blocked by the inner frame 24. Thus, the width of the inner frame 24 of the mask holder 20 is preferably smaller than the width of a corresponding lattice 12 on the mask 10. Such a relationship also facilitates aligning the mask 10 with the mask holder 20 because a certain tolerance is allowed in accuracy with which the lattice 12 of the mask 10 is aligned with the inner frame 24 of the mask holder 20. In this embodiment, the width of the inner frame 24 is, for example, about 200 $\mu$m smaller than the width of the lattice 12.

FIG. 2 is a partial section of the mask holder 20 adapted to hold a mask 10. The mask holder 20 comprises the outer frame 22 and the inner frame 24. The outer frame 22 and the inner frame 24 are preferably made of a dielectric material such as ceramic. Multiple electrodes 30 are positioned inside the outer frame 22 and inner frame 24. Each of the electrodes 30 is connected to one pole of a power source 32. The other pole of the power source 32 and the mask 10 itself are grounded. This arrangement constitutes a "unipolar" electrostatic chuck 35, by which the mask 10 is held by means of electrostatic attraction.

As an alternative to the unipolar configuration described above, the electrostatic chuck can also have a "bipolar" configuration. In the bipolar configuration, each electrode 30 is positioned within the outer frame 22; the inner frame 24 is connected to both a positive pole and a negative pole. A bipolar electrostatic chuck need not ground the mask 10. Although it is preferable to provide the electrodes 30 within both the outer frame 22 and members of the inner frame 24 to produce electrostatic attraction, the electrodes 30 may be provided within only one of the outer frame 22 and the inner frame 24.

The shape of the mask holder 20 can be modified in various ways, taking into account the shape of the membranous areas 14 and the outline of the pattern of which each membranous area forms a part, without being limited to the configuration shown in FIG. 1. By way of example, FIGS. 3(a)–3(c) illustrate examples of such modifications. The mask holder 20a of FIG. 3(a) is similar to the mask holder 20 of FIG. 1. The mask holder 20c shown in FIG. 3(c) simply requires alignment of the lattice 12 of the mask 10 and the inner frame 24 only in one dimension (i.e., in the vertical direction in the drawing). Although the inner frame 24 is connected to the outer frame 22 at four points in each of the examples shown in FIGS. 3(a)–3(c), such connections can involve fewer (e.g., 2) or more points of connection.

In general, using a charged particle beam (e.g., an electron beam or ion beam) as the exposure beam can result in a localized charge accumulation if an electrical insulator exists in the vicinity of the path of the exposure beam. Charge accumulations can adversely affect the path of the exposure beam. In the preferred embodiment, the outer frame 22 and the inner frame 24, which are preferably made of a dielectric material, are preferably coated with a conductive film 34 (FIG. 2). The conductive film 34 is grounded to provide a discharge path for accumulated charge. As a result, the exposure beam can be directed through the mask without being affected by accumulated charge.

Whenever the mask 10 is held to the mask holder 20 via an electrostatic chuck, the conductive film 34 is preferably not formed on the top surface 28 of the mask holder 20 (which directly contacts the mask 10). Also, it is not necessary to form the conductive film 34 over the entire surface of the outer frame 22 and the inner frame 24. Any areas not illuminated by the exposure beam do not require a coating of conductive film 34. Thus, the embodiment shown in FIG. 2 lacks a conductive film 34 on the surface 28 directly contacting the mask 10.

Figure 5:
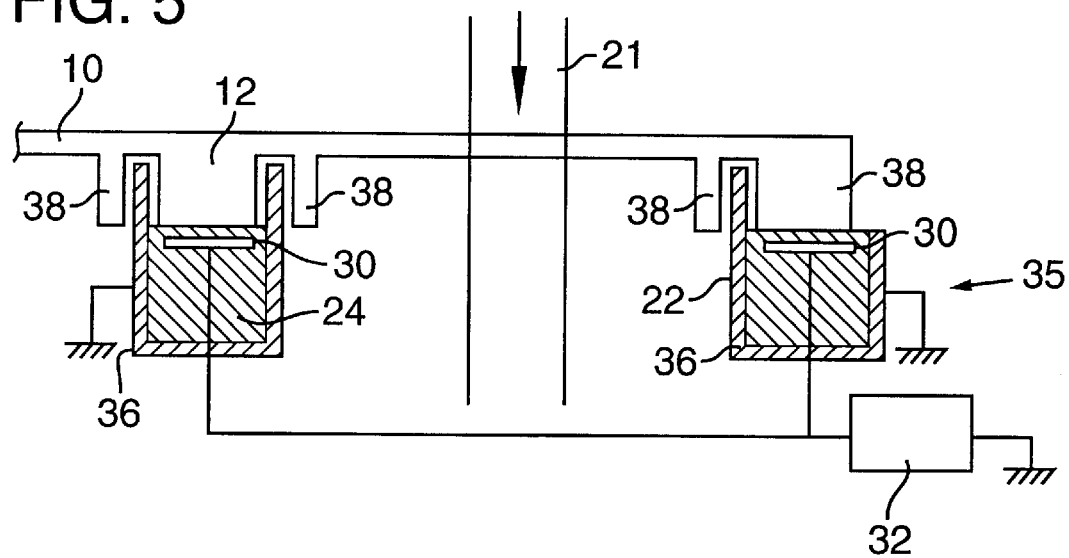
FIG. 5 is a partial sectional view showing another alternative configuration of the mask holder according to the first embodiment.

It is possible for a gap to arise between the conductive film 34 and the mask 10 unless the mask 10 is precisely aligned (or registered) with the mask holder 20. The embodiment shown in FIG. 4 advantageously eases the task of obtaining precise alignment. In FIG. 4, a conductive film 34 is formed over a small portion of the top surface 28 of the mask holder 20 directly contacting the mask 10, but not over an area to which electrostatic charge is applied. Even with such an arrangement, the path of the exposure beam 21 (e.g., electron beam) passing through the pattern area of the mask 1 (i.e., membranous areas 14) may be affected by a leakage field from the electrode 30. To prevent the leakage field, grounded electrodes 36 are formed in the outer frame 22 and the inner frame 24 of the mask holder 20 so that the lattice 12 of the mask 10 is surrounded by the grounded electrodes 36, as shown in FIG. 5. This arrangement can prevent charge accumulation on the mask holder 20 and leakage of the electric field generated by the electrostatic chuck 35.

In the configuration of FIG. 5, additional auxiliary frames 38 are defined by the mask 10 so that the grounded electrodes 36 of the mask holder 20 are inserted between the lattice 12 and the auxiliary frames 38 of the mask 10. This arrangement can prevent leakage of the electric field more efficiently.

The embodiments described above were presented in connection with using an electron beam as a charged-particle beam for projection exposure. However, if an X-ray or laser beam, for example, is used as the exposure beam, the conductive film 34 is not required.

Another embodiment of a mask holder 40 according to the invention is shown in FIG. 6 (a).

Figure 6A:
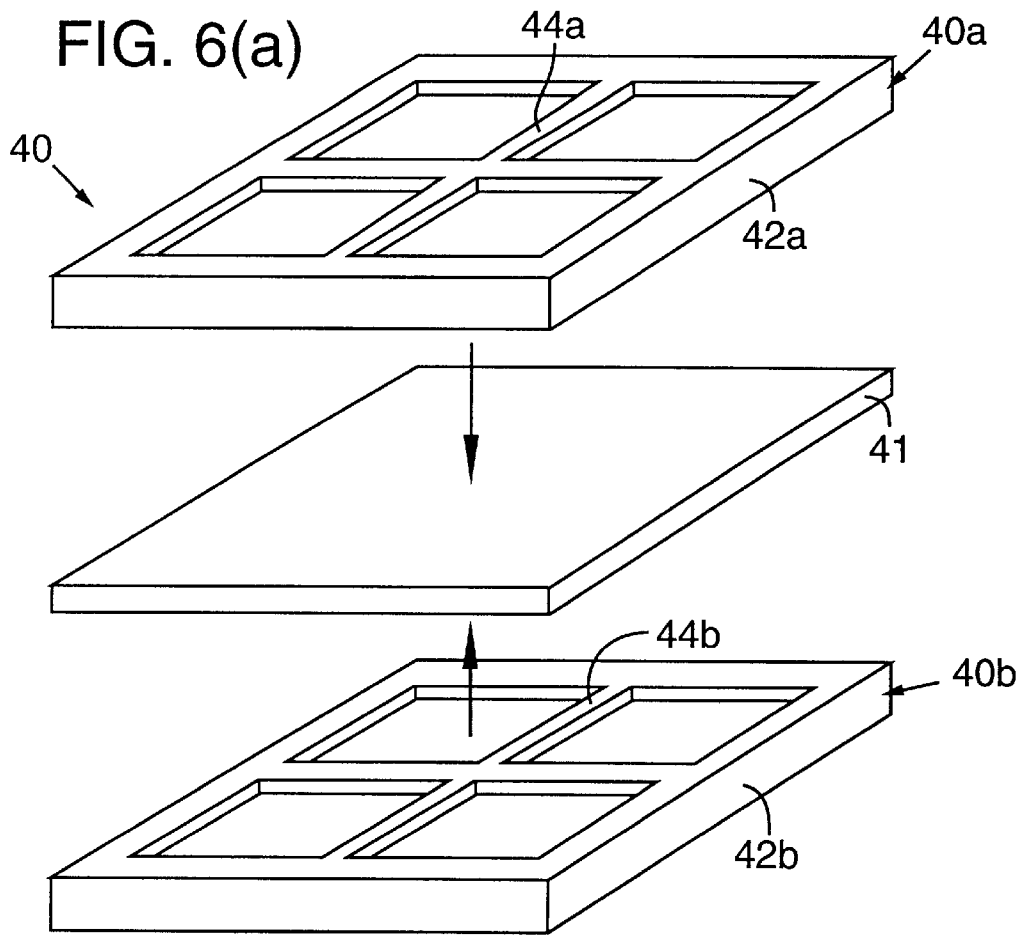
FIG. 6(a) is a perspective view of a mask holder according to a second representative embodiment of the invention.

In the embodiment shown in, e.g., FIG. 1, the mask 10 was electrically conductive and was held by the mask holder 20 via electrostatic attraction. However, if the mask is made of electrically nonconductive material, the mask cannot be held by electrostatic attraction to the mask holder. The mask holder 40 shown in FIG. 6(a) is a representative embodiment usable whenever the mask 41 is non-conductive. The mask holder 40 comprises two portions 40a, 40b between which the mask 41 is sandwiched. Each portion 40a, 40b comprises an outer frame 42a, 42b, and inner frame 44a, 44b, respectively.

Although, in FIG. 6(a), the two portions 40a, 40b have the same configuration, such similitude is not necessary. For example, the inner frame 44a may be eliminated from the upper portion 40a. So long as the lower portion 40b has an inner frame 44b, distortion of the mask 41 can be prevented, with corresponding improvement in the fidelity of pattern transfer from the mask 41 to a sensitive substrate.

Figure 6B:
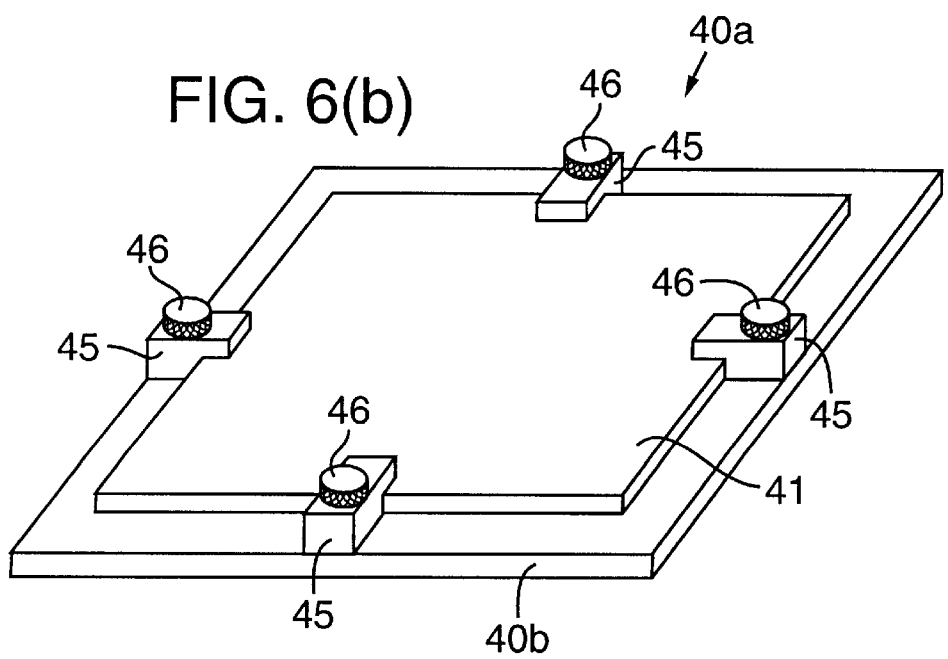
FIG. 6(b) is a perspective view of a variation of the FIG. 6(a) embodiment.

A representative variation of the FIG. 6(a) embodiment is shown in FIG. 6(b). The FIG. 6(b) embodiment comprises the lower portion 40b (similar to that shown in FIG. 6(a)) that supports the mask 41. The mask 41 is secured to the lower portion by an "upper portion" 40a that comprises multiple clamps 45. It will be appreciated that the clamps 45 can have any of various configurations for their intended purpose. The clamps 45 can be secured to the lower portion 40b by, e.g., thumbscrews 46 or other appropriate fastener as required.

Figure 7:
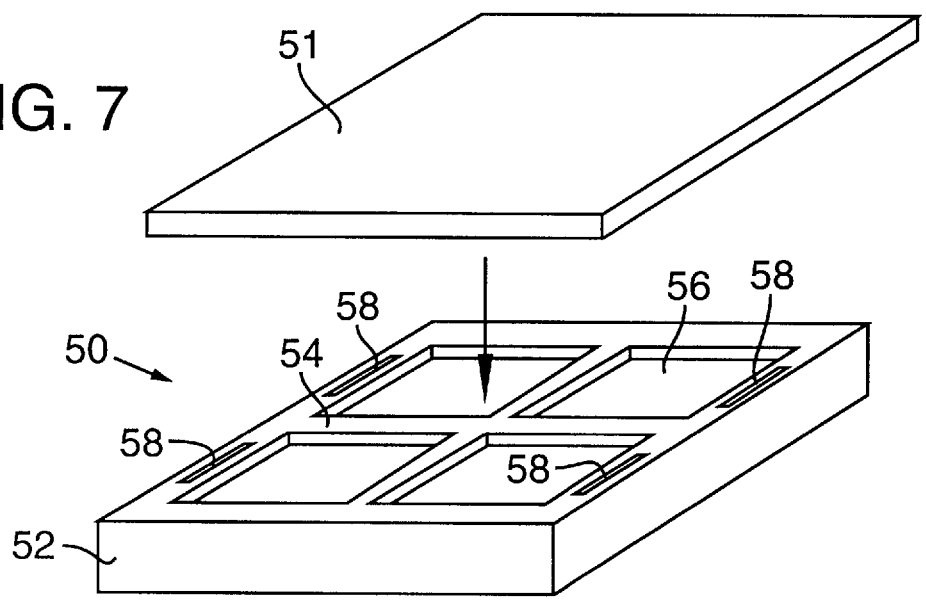
FIG. 7 is a perspective view of a mask holder according to a third representative embodiment of the invention.
Figure 8:
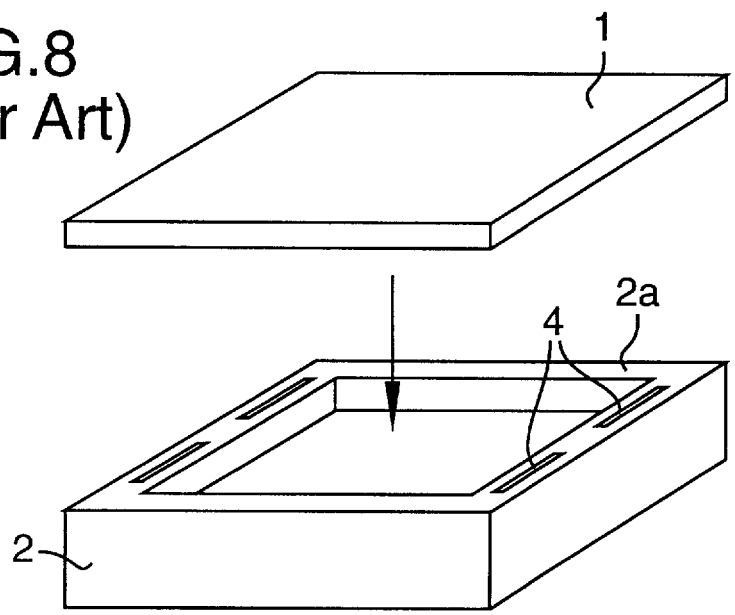
FIG. 8 is a perspective view of a prior-art mask holder.

FIG. 7 illustrates a mask holder 50 according yet another embodiment of the invention. The mask holder 50 can be used for masks 51 that are either conductive or non-conductive, because the mask 51 is held in place by the vacuum chuck 58.

The mask holder 50 is particularly useful under conditions in which exposure does not occur in a vacuum. In FIG. 7, vacuum chucks 58 are provided along the outer frame 52. The vacuum chucks 58 can be the same as used in prior-art mask holders. In addition to or instead of being provided along the outer frame 52, vacuum chucks can also be provided along the inner frame 54. In any event, the mask 51 is supported by the inner frame 54 and the outer frame 52, and distortion of the mask 51 due to the weight of the mask itself can be prevented.

The inner frames provided in any of the foregoing embodiments are beneficial in another way. Specifically, any heat generated or accumulated in the mask can be transferred to the inner frame of the mask holder through direct contact between the lattice of the mask and the inner frame of the mask holder, thereby removing the heat from the mask. To efficiently remove heat from the mask in such a manner, the mask holder is preferably made of a material having a high thermal conductivity, such as silicon carbide or diamond.

In addition, the mask holders described in the first through third embodiments can be used in combination with one another.

Thus, the inner frame provided with a mask holder according to the invention is useful for suppressing distortion of a mask mounted on the mask holder and for removing heat from the mask.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A mask holder for holding a microlithography mask defining a pattern to be projection-transferred to a sensitive substrate, the mask comprising a periphery, an inner region, and a main surface, the mask holder comprising an outer frame and an inner frame connected to the outer frame, the outer frame being adapted to contact the periphery of the main surface of the mask to hold the mask and the inner frame being adapted to contact the inner region of the main surface of the mask so as to provide support for the inner region of the mask when the mask is being held by the mask holder.

2. The mask holder of claim 1, adapted to hold a mask comprising members of a lattice and pattern areas extending between the members, the members of the lattice being configured to be in registration with the inner frame of the mask holder whenever the mask is being held by the mask holder.

3. The mask holder of claim 2, further comprising an electrostatic chuck for holding the mask to the mask holder by electrostatic attraction.

4. The mask holder of claim 3, further comprising a ground electrode enclosing the mask lattice in a region to which electrostatic attraction is applied by the electrostatic chuck.

5. The mask holder of claim 1, further comprising an electrically conductive film that contacts the mask when the mask is being held by the mask holder, the electrically conductive film being connectable to an electrical ground.

6. The mask holder of claim 1, further comprising an electrostatic chuck for holding the mask to the mask holder by electrostatic attraction.

7. The mask holder of claim 1, further comprising a vacuum chuck for holding the mask to the mask holder by application of a reduced pressure.

8. The mask holder of claim 1, comprising a first mask-holder portion and a second mask-holder portion, the mask being supported by the first mask-holder portion and secured to the first mask-holder portion by the second mask-holder portion whenever the mask is being held by the mask holder.

9. The mask holder of claim 8, wherein the mask is sandwiched between the first and second mask-holder portions whenever the mask is being held by the mask holder.

10. The mask holder of claim 8, wherein the second mask-holder portion comprises a clamp adapted to hold the mask to the first mask-holder portion.

11. The mask holder of claim 10, wherein the second mask-holder portion comprises multiple clamps adapted to peripherally hold the mask to the first mask-holder portion.

12. The mask holder of claim 1, further comprising a thermally conductive material in contact with the mask whenever the mask is being held by the mask holder.

* * * * *